United States Patent [19]

Sunami et al.

[11] Patent Number: 4,873,560
[45] Date of Patent: Oct. 10, 1989

[54] DYNAMIC RANDOM ACCESS MEMORY HAVING BURIED WORD LINES

[75] Inventors: Hideo Sunami, Tokyo; Shinichiro Kimura, Hachioji; Toru Kaga, Urawa, all of Japan

[73] Assignee: Hitachi, Ltd., Tokyo, Japan

[21] Appl. No.: 155,698

[22] Filed: Feb. 16, 1988

[30] Foreign Application Priority Data

Apr. 1, 1987 [JP] Japan ................................. 62-77416

[51] Int. Cl.$^4$ ..................... H01L 29/78; H01L 29/06; H01L 27/02
[52] U.S. Cl. .................................... 357/23.6; 357/55; 357/42
[58] Field of Search ........................... 357/23.6, 55, 42

[56] References Cited

U.S. PATENT DOCUMENTS

| | | | |
|---|---|---|---|
| 4,476,547 | 10/1984 | Miyasaka | 357/23.6 |
| 4,710,789 | 12/1987 | Furutani et al. | 357/23.6 |
| 4,769,786 | 9/1988 | Garnache et al. | 357/23.6 |

OTHER PUBLICATIONS

Taguchi et al., "Dielectrically Encapsulated Trench Capacitor Cell", IEDM 86, pp. 136–139.
Kaga et al., "Half-$V_{cc}$ Sheath-Plate Capacitor DRAM Cell with Self-Aligned Buried Plate Wiring", IEEE Transactions on Electron Devices, vol. 35, No. 8, Aug. 1988, pp. 1257–1263.

*Primary Examiner*—Rolf Hille
*Assistant Examiner*—Robert P. Limanek
*Attorney, Agent, or Firm*—Antonelli, Terry & Wands

[57] ABSTRACT

This invention relates to a very large scale dynamic random access memory, and discloses a memory cell having a reduced step on the device surface portion and being hardly affected by incident radioactive rays. In a semiconductor memory consisting of a deep hole bored in a semiconductor substrate, a capacitor formed on the sidewall portion at the lower half of the deep hole and a switching transistor formed immediately above the capacitor, at least the half of a word line constituting the gate of the switching transistor is buried in an elongated recess formed at the surface portion of the semiconductor substrate.

42 Claims, 20 Drawing Sheets

DYNAMIC RANDOM ACCESS MEMORY HAVING BURIED WORD LINES

BACKGROUND OF THE INVENTION

This invention relates generally to a semiconductor memory. More particularly, the present invention relates to a dynamic random access memory (hereinafter referred to as "DRAM") having small cells, stable operation, and having memory cells suitable for higher packing density.

Examples of conventional semiconductor memories are shown in FIGS. 1A to 1D of the accompanying drawings. FIGS. 1A and 1B show the semiconductor memory disclosed in JPA 61-184867 and FIGS. 1C and 1D show the semiconductor memory disclosed in JPA 62-51253. In these prior art references, a capacitor is formed at the lower half of a deep hole while a switching transistor is formed at the upper half of this deep hole, and a word line is then formed to cover a bit line which is connected to a drain of the transistor. Because the word line is formed after the drain is formed, the word line is formed on the drain, and consideration is not taken for higher packing density and the increase in the parasitic capacitance between the word line and the drain.

When the memory cells are arranged in a high density, they are disposed at the points of intersection between the word lines and the bit lines to constitute a so-called "cross-point switch". If the word lines are turned ON under this construction (see FIG. 1B), the signal of the capacitor is applied to all the bit lines to turn them ON so that the arrangement unavoidably becomes an open bit line arrangement. Accordingly, this circuit arrangement cannot accomplish a folded bit line arrangement which, exhibits characteristically low noise and therefor is not sufficient from the aspect of a stable circuit operation.

Furthermore, since the capacitor and the switching transistor is buried in the deep hole bored in the substrate in each of the structures shown in FIGS. 1A and 1C, the continuous portion of the word line is disposed on the substrate, thereby forming a step on the substrate.

Another prior art semiconductor memory is discussed in "1985, IEEE International Electron Devices Meeting, Technical Digest", pp. 714-717.

As a result of studies of these prior art techniques, the inventors of the present invention discovered the following problems.

The semiconductor memory cell shown in FIG. 1C is fabricated first forming the drain of an n+ region of the switching transistor (to be connected to the bit line) on the surface of an Si substrate. Then the deep hole is bored in such a manner as to penetrate through the drain and thereafter the word line (which is integral with the gate of the switching transistor) is formed at the upper part of this deep hole. This fabrication method produces a device having the following problems.

(1) Unlike ordinary MOS transistors (whose drain is formed in self-alignment with the gate after the gate is formed), the drain is covered with the gate so that the parasitic capacitance between the drain and the gate increases.

(2) Since the drain is covered with the gate, the bit line is formed by extending the n+ region of the drain of the switching transistor.

(3) Only gate portion of the word line is buried in the hole disposed in the substrate while other portions extend on the substrate. This generates a step and is likely to cause disconnection of a metallization layer to be formed thereon.

These problems impede higher packing density and, consequently, also impede larger scale DRAMs.

Though the fabrication method is different, the structure of the memory cell shown in FIG. 1A also have the above-mentioned problems.

SUMMARY OF THE INVENTION

It is therefore an object of the present invention to make the surface of a memory cell array as flat as possible. As the integration density increases to 4M bits, to 16M bits and further to 64M bits, the step developing on the memory cell array becomes a critical problem. The step not only causes disconnection of the metallization layer to be disposed there on but also causes problems with pattern printing using a photo-resist.

In particular, the greater the step, the more difficult the fine etching process.

As the packing density of the memory cell array is increased, the improvement of its operation speed becomes more and more difficult. Though the operation speed depends on various factors, the parasitic capacitance is one of the most significant factors. The operation speed of a large capacity memory is retarded unless its parasitic capacitance is minimized.

The object of the invention described above can be accomplished by burying the word line in a long recess formed in the surface of the Si substrate, forming the drain of the switching transistor after this word line is formed, and then connecting the bit line to this drain.

The object of the invention can also be accomplished by disposing a stripe recess on the surface portion of the semiconductor substrate, forming a deep hole below this recess, forming the capacitor on the sidewall of the deep hole, forming the switching transistor on the sidewall of the recess above the capacitor and burying two word lines into the recess.

Since the word line in buried in the recess, the surface of the substrate is not covered with the word line and the drain is exposed on the substrate surface. Therefore, the bit line can be connected easily to this drain and the parasitic capacitance of the bit and word lines does not adversely increase. Moreover, since there is no excessive region, in which the drain is covered with the word line, this arrangement is advantageous for higher packing density.

In the conventional cells, the bit line is formed by extending the diffusion layer of the drain so that the capacitance $C_B$ of the bit line increases and its ratio $C_S/C_B$ to the storage capacitance $C_S$ of the memory cell drops. For this reason, the circuit operation becomes unstable. Moreover, the inflowing ratio and degree of electrons among the electron-hole pairs generated on the surface of the Si substrate due to $\alpha$-particles that hit the substrate surface increase, and this also results in the unstable circuit operation. Since this diffusiton layer region is small in the present invention, the drawback of the prior art structures described above is lessened.

When the potential of one of the two word lines is raised to a voltage (ordinarily, $V_{cc}$) at which the switching transistor is turned ON, the switching transistors connected to every other capacitor of the line of capacitors are turned ON. When the other of the word line pair is turned ON, the switching transistors connected to the remaining capacitors are turned ON. Accordingly, it is possible to accomplish the folded bit line arrangement and the characteristic features of this arrangement, i.e. low noise and stable circuit operation.

It is therefore another object of the present invention to provide a memory cell suitable for higher packing density and a memory constituted by such memory cells.

It is still another object of the present invention to provide a technique capable of accomplishing self-alignment of the word line and the drain.

It is a further object of the present invention to provide a memory cell capable of easily forming a folded bit line arrangement and technique of forming an array using such memory cells.

It is still another object of the present invention to provide a memory cell structure which can be formed with a reduced step.

It is still another object of the present invention to provide a memory cell structure which is not easily affected by incident α-rays.

It is still another object of the present invention to provide a memory cell structure having a reduced parasitic capacitance between the word line and the drain region of the switching transistor.

It is still another object of the present invention to provide a memory cell structure having a reduced parasitic capacitance of the data line.

It is still another object of the invention to provide a memory cell structure capable of applying a potential different from a substrate potential to a plate electrode.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Hereinafter, some preferred description of the invention will be described with reference to the accompanying drawings.

FIGS. 2 to 15 show a first aspect of the present invention, wherein one word line (to serve as the gate) is buried in a long recess and FIGS. 16 to 34 show other aspects of the present invention, wherein two word lines (to serve as the gate) are buried in the long recess.

Though FIGS. 12, 13, 14, 30, 32, 33 and 34 show the memory cells in other arrangements of the present invention, they can of course be applied to, or combined with the other arrangements as is obvious from the contents thereof.

Figure 1A:
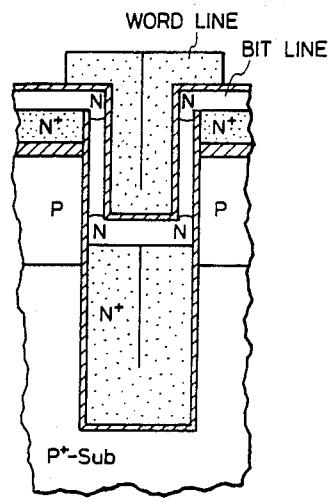
FIGS. 1A and 1D show conventional semiconductor memories.
Figure 1B:
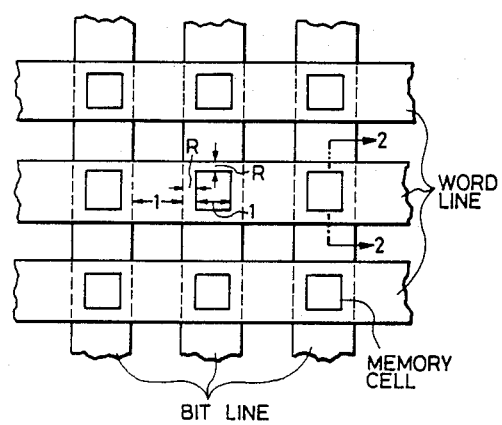
Figure 1C:
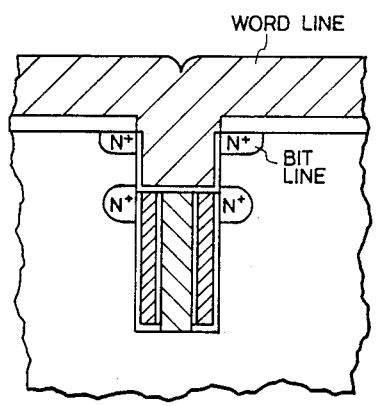
Figure 1D:
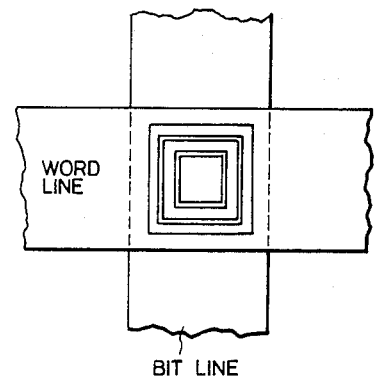
Figure 2:
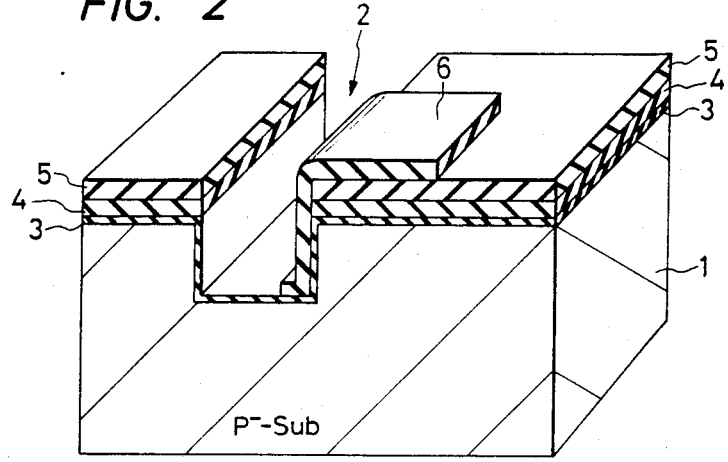
FIGS. 2 to 10C show progressive manufacturing stages of one aspect of the present invention.

As shown in FIG. 2, a recess 2 which is 1 μm wide and 1 μm deep is formed in a p-type 10 ohm/cm silicon (Si) substrate by an ordinary photo-etching method using, as masks, a 10 nm-thick thermally oxidized $SiO_2$ film 3, a 200 nm-thick $Si_3N_4$ film 4 formed by CVD (Chemical Vapor Deposition) and a 200 nm-thick $SiO_2$ film 5 formed by CVD. After the inside of the recess 2 is oxidized thermally to form an $SiO_2$ film, a 100 nm-thick $Si_3N_4$ mask 6 is formed in a channel and drain region of a switching transistor to be formed later, by deposition by CVD and photo-etching.

Figure 3:
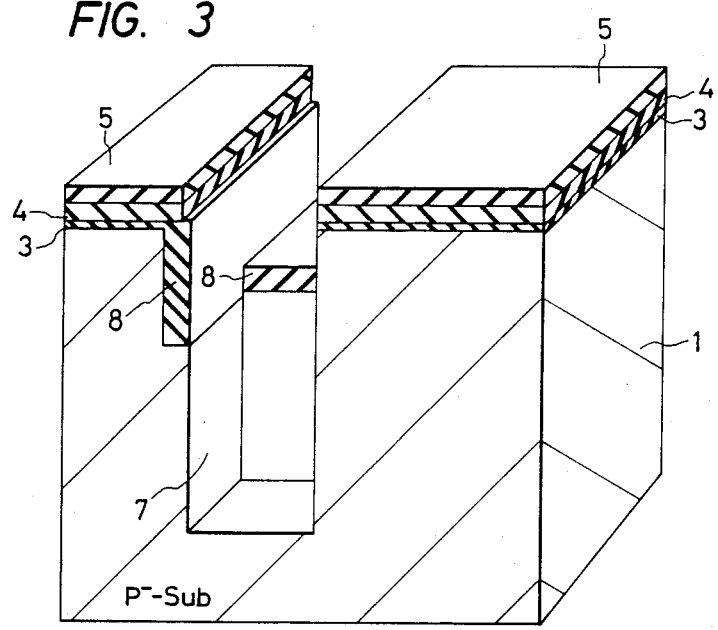

Boron (B) is then introduced into the inner wall of the recess to form a parasitic-channel stopper and a 200 nm-thick field $SiO_2$ film 8 is formed on the inner wall of the recess on which the $Si_3N_4$ film is not deposited, by wet oxidation. After the $Si_3N_4$ mask 6 is removed, a deep hole 7 is bored at a predetermined portion of the recess 2 of the Si substrate 1 by photo-etching as shown in FIG. 3. At this time, the CVD $SiO_2$ film 4 serves as part of the mask.

Figure 4:
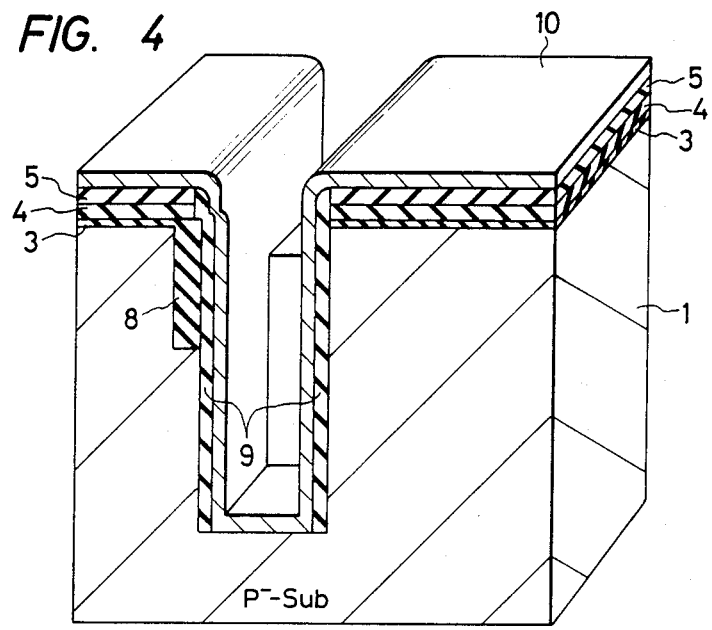

Thereafter, a 100 nm-thick CVD $SiO_2$ film is deposited to the entire surface, which is then etched. The CVD $SiO_2$ film remains on the side surfaces of the deep hole 7 and recess 2 but the CVD $SiO_2$ film at the bottom of the deep hole 7 is removed so that the surface of the Si substrate 1 is exposed. Thereafter, a 100 nm-thick plate 10 of polycrystalline silicon is deposited to the entire surface. As shown in FIG. 4, the remaining CVD $SiO_2$ film is used as a sheath 9.

Figure 5:
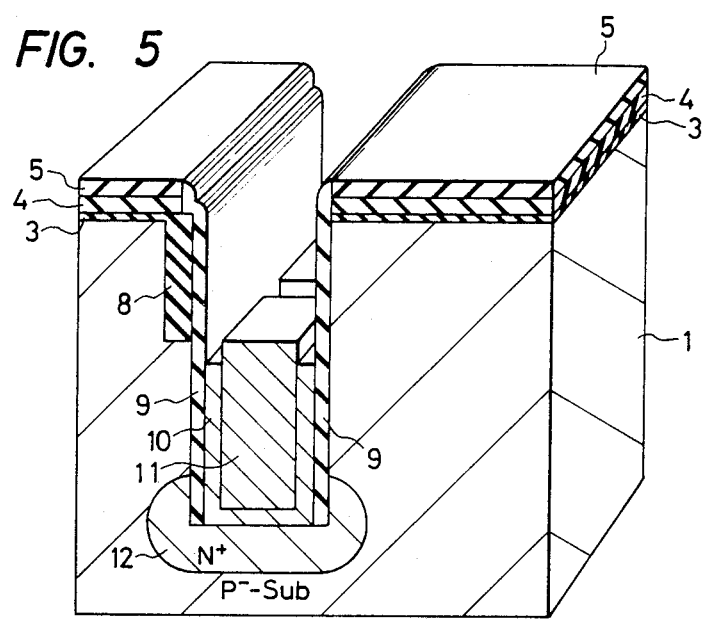

Subsequently when a photo-resist is deposited on the entire surface, the recess 2 as well as the deep hole 7 are buried by the photo-resist. When etching is made on the entire surface, the photo-resist 11 remains at only the lower half of the deep hole 7. When the plate 10 is etched by using the photo-resist 11 as the mask, the plate 10 remains at only the lower half of the deep hole 7 as shown in FIG. 5. Since boron (B) is added in order to provide the plate 10 with conductivity, there is formed a plate wiring portion 12 of an n+-layer which extends from the bottom of the deep hole 7 into the Si substrate 1.

Figure 6:
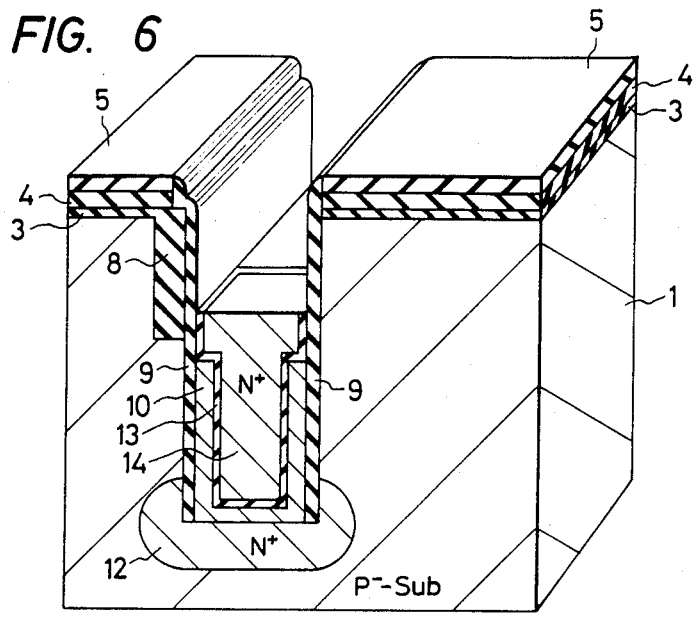

Then, the photo-resist 11 is removed and a 10 nm-thick capacitor insulating film 13 consisting of a two-layered film of $SiO_2$ and $Si_3N_4$ is deposited. Furthermore, a storage node 14 of polycrystalline silicon (Si) to which As is added is deposited to the entire surface. Thereafter, the polycrystalline Si is etched on the entire surface so as to leave it at the lower half of the deep hole 7 as shown in FIG. 6. At this time, the portion of the thin capacitor insulating film 13, which is not covered with the storage node 14, is also removed.

Figure 7:
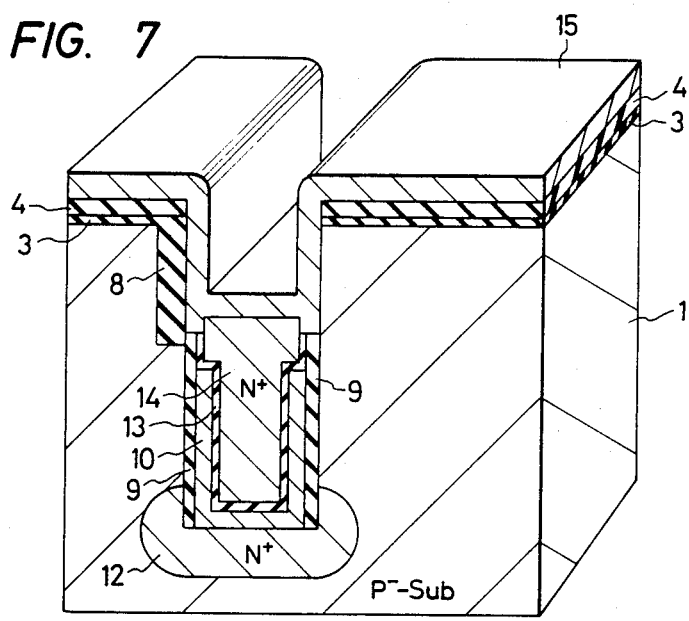

Thereafter the capacitor insulating film 13 is etched a little bit and then the CVD $SiO_2$ film 9 is etched, whereby the Si substrate surface is exposed at its portion where it is not covered with the field $SiO_2$ film 8. A polycrystalline Si film 15 is then deposited to the entire surface, as that the storage node 14 and the Si substrate 1 are connected to each other through the polycrystalline Si film 15 as shown in FIG. 7.

Figure 8:
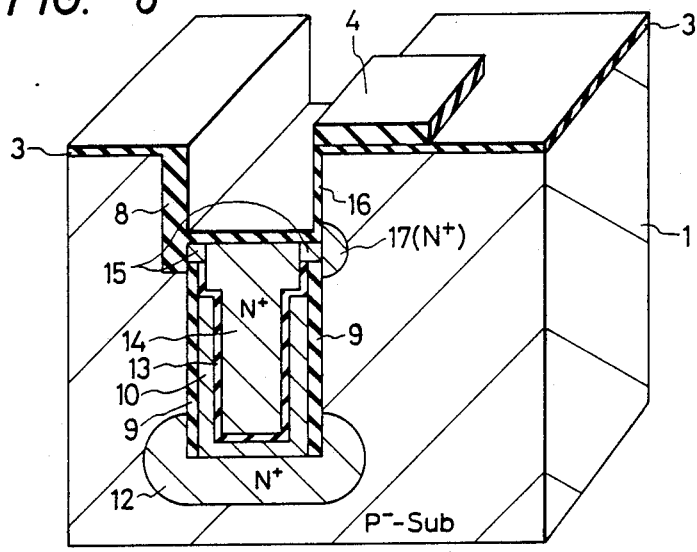

The polycrystalline Si film 15 is etched isotropically over the entire surface, as that remains only at the portion encompassed by the periphery of the storage node 14 and the Si substrate 1. Next, the $Si_3N_4$ film 4 is removed by photo-etching at portions other than the portion which is to serve as the drain of the switching transistor. Thermal oxidation is carried out to form a gate $SiO_2$ film 16, 10 nm in thickness, part of the recess 2 as shown in FIG. 8. At this time, As soaks out from the storage node and form a source 17 in the Si substrate 1 through polycrystalline Si 15.

Figure 9:
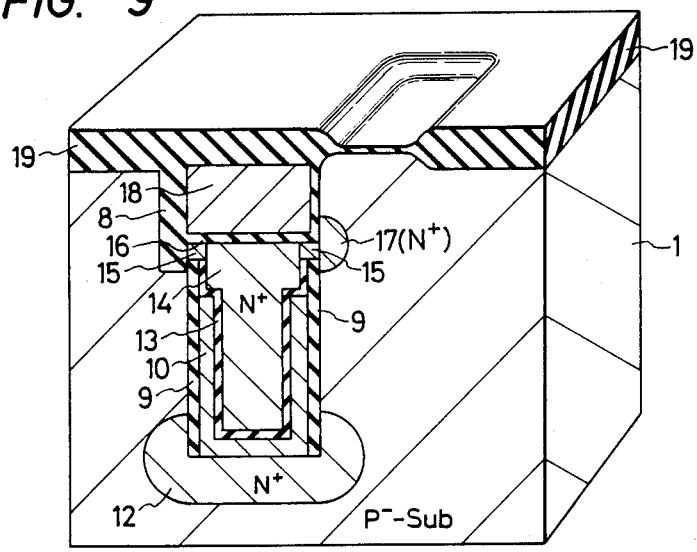

Thereafter, polycrystalline Si or $WSi_2$ film is deposited so that the recess 2 is buried and etching is then made over the entire surface to leave the film only inside the recess. This film serves as the word line (gate) 18. Subsequently, thermal oxidation is carried out, to form a 500 nm-thick silicon dioxide film and the surface of the Si substrate not covered with the $Si_3N_4$ film 4 and the word line 18 are oxidized to form the second field $SiO_2$ film 19. The $Si_3N_4$ film 4 is then removed, and only a thin $SiO_2$ film remains at the drain as shown in FIG. 9.

Figure 10A:
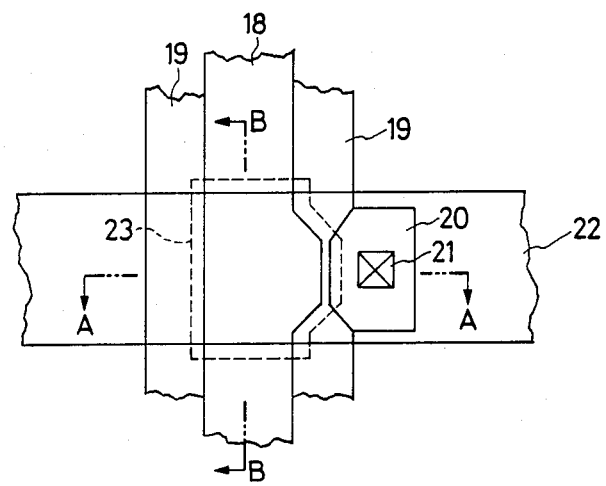
Figure 10B:
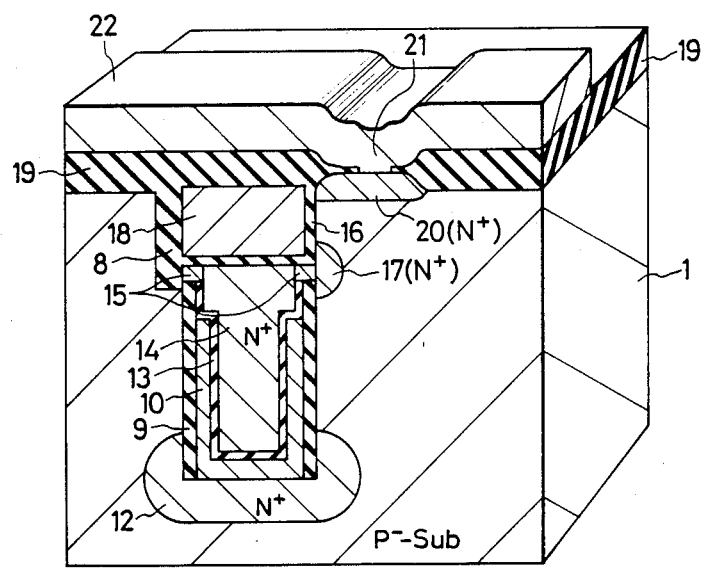

As shown in FIG. 10B which is a sectional view taken along line A—A of FIG. 10A, arsenic (As) ions are implanted to form the drain 20 of the n+ layer. A contact hole 21 is bored through the $SiO_2$ film 3 and a bit line 22 of 500 nm-thick aluminum (Al) is formed.

When $\frac{1}{2} V_{cc}$ (2.5 V when $V_{cc}$ is 5 V) is applied to the plate wiring 12 and $V_{BB}$ (= −3 V) is applied to the substrate 1, a capacitor 23 is formed between the plate 10 and the storage node 14. There is thus formed a switching transistor by the word line 18 which serves as the gate, and the source 17 and the drain 20. A memory cell of a dynamic MOS memory is constituted by the capacitor and switching transistor as shown in FIG. 10A. FIG. 10B is a sectional view taken along line A—A of FIG. 10A which is a plan view.

Figure 10C:
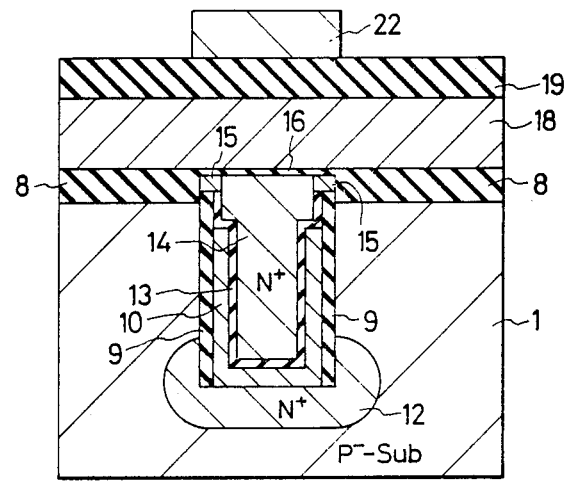

FIG. 10C is a sectional view taken along line B—B of FIG. 10A.

Figure 11:
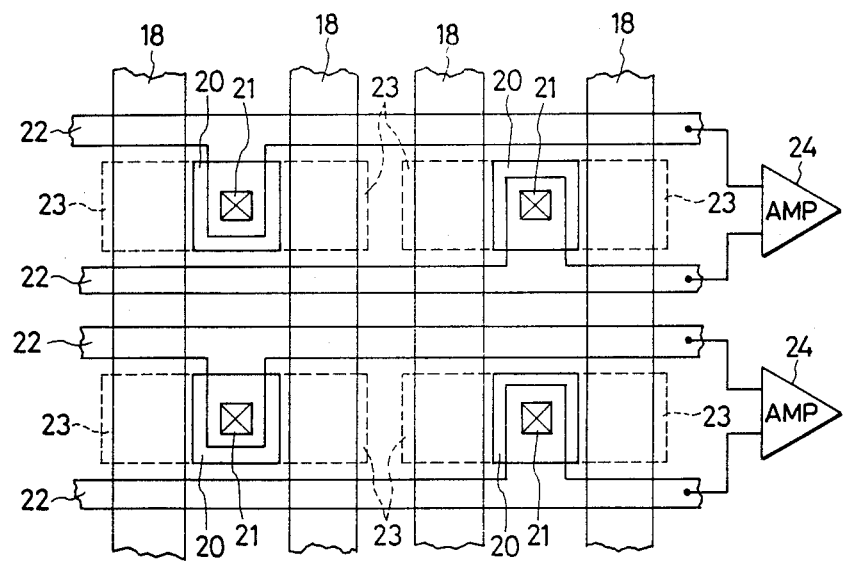
FIG. 11 shows a second aspect of the present invention.

A plurality of memory cells described above are arranged to constitute a memory cell array. As shown in FIG. 11, two capacitors 23 are arranged in such a manner as to face one drain 20 and the number of contact holes 21 is reduced to half of the number of capacitors 23 so as to accomplish higher packing density. Each bit line 22 connects every other capacitor set consisting of two capacitors as shown in FIG. 11, and two bit lines are connected as differential input to a sense amplifier 24. When one of the word lines 18 is turned ON, only one of the memory cells connected to one of the bit lines is turned ON and only induced noise occurs on the other of the bit lines. This structure is the so-called "folded bit line arrangement" and since common mode noise is eliminated by differential sensing, the circuit has high noise margin and high operational stability.

Figure 12:
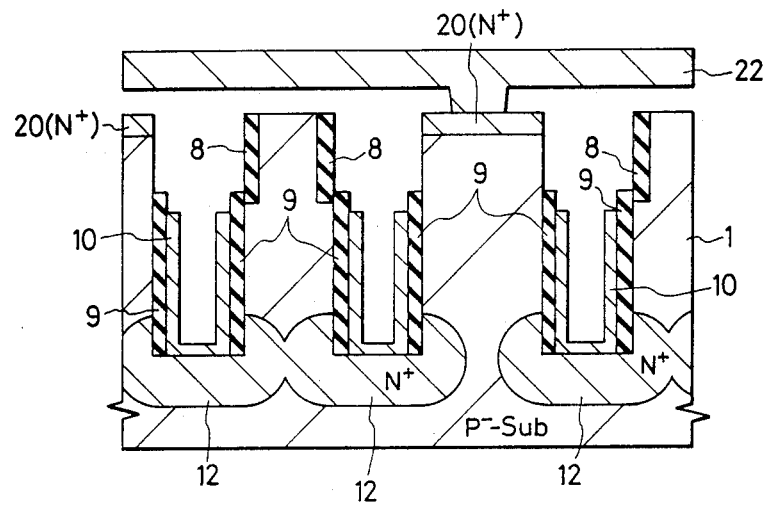
FIG. 12 shows a third aspect of the present invention.

The single memory cell explained with reference to FIGS. 2 to 10C has an isolated plate wiring 12. When a plurality of such memory cells are arranged as shown in FIG. 11, the plate wirings 12 are connected to one another as shown in FIG. 12 and form one plate wiring 12 as a whole. Since the structure after formation of the plate 10 is not necessary for the description of the present invention, it is omitted from FIG. 12 except for the bit line 22 and the drain 20.

If the memory cells are densely arranged plane-wise to constitute a memory array, the plate wiring 12 covers the entire surface and the p-type substrate 1 at the upper part of the plate wiring 12 is electrically isolated from the p-type substrate at the lower part of the plate wiring. In such case, if the memory cells are arranged in spaced-part relation at part of the memory array, they can be connected to the lower substrate 1 at this part which is convenient for applying $V_{BB}$.

Figure 13:
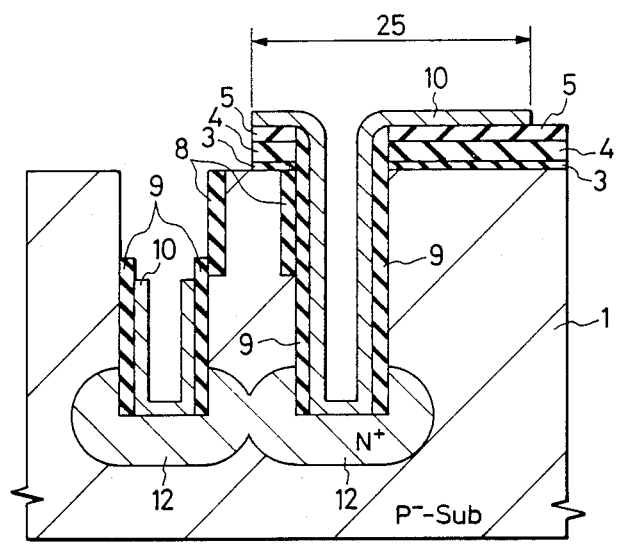
FIG. 13 shows a fourth aspect of the present invention.

A power supply portion 25 for the plate wiring 12 may be formed by leaving photo-resist at a predetermined portion when the sheath 9 and the plate 10 are etched over the entire surface as shown in FIG. 13. The plate 10 remains on the surface of the Si substrate and if the aluminum (Al) electrode is connected to the plate 10 at this portion, $\frac{1}{2} V_{cc}$ potential can be applied.

Figure 14:
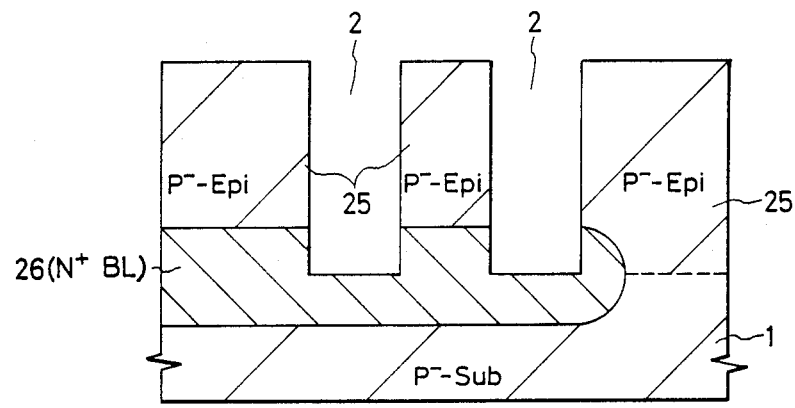
FIG. 14 shows a fifth aspect of the present invention.

Though the plate wiring 12 is formed by diffusion from the bottom of the deep hole 2 in the above description, it is also possible to form a buried layer 26 to which As or Sb is added at a predetermined portion of the p-type Si substrate 1 as shown in FIG. 14. The buried layer 26 is used as the plate wiring 12 by growing a p-type epitaxial layer 25 on the buried layer 26. If the bottom of the deep hole 2 reaches the buried layer 26 as shown in FIG. 14, the plate 10 is connected to this buried layer.

If an n-type substrate is used as the Si substrate 1 and the bottom of the deep hole 2 reaches the Si substrate 1 through the epitaxial layer 25, there is no need to form the buried layer 26.

Figure 15:
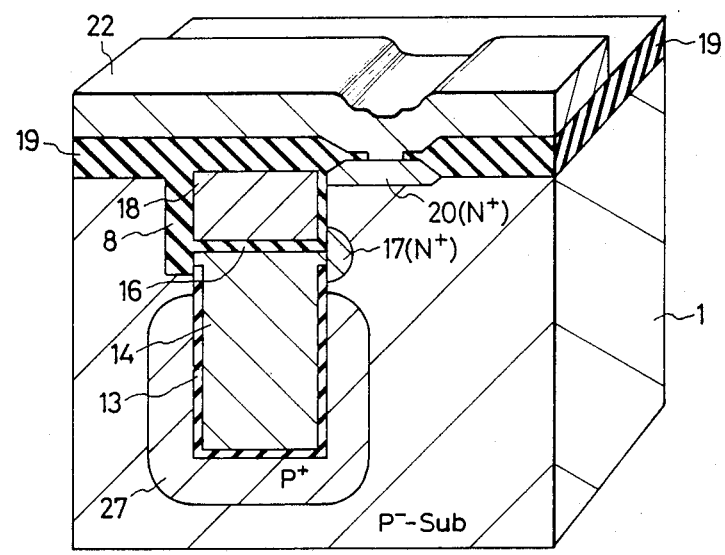
FIG. 15 shows a sixth aspect of the present invention.

Though the invention as described above represents the structure wherein the plate 10 is encompassed by the sheath 9 of the $SiO_2$ film, the present invention may include a capacitor structure wherein a p+ high concentration layer is disposed at the lower half of the deep hole 2 formed in the p-type Si substrate 1. The capacitor insulating film is disposed on this high concentration layer 27 as the plate, as shown in FIG. 15.

The process described is only an example and is not particularly limitative. For example, the second field $SiO_2$ film formed on the Si substrate 1 may be formed before the deep hole 2 is formed, and second field oxidation may be made by deposition of the $SiO_2$ film by CVD process.

Though the drain 20 of the switching transistor is formed on only one of the sidewalls of the deep hole 2, it may be formed simultaneously on the other opposing sidewall.

Furthermore, since polycrystalline Si 15 comes into contact with only the end portion of the field $SiO_2$ film 8 but is not in contact with the Si substrate 1 as shown in FIG. 10C, the source 17 is not formed, but the source 17 may be formed if the position of polycrystalline Si 15 is lower and comes into contact with the Si substrate 1.

Though FIG. 11 shows the folded bit line arrangement, it is also possible to employ the ordinary open bit line arrangement.

Figure 16:
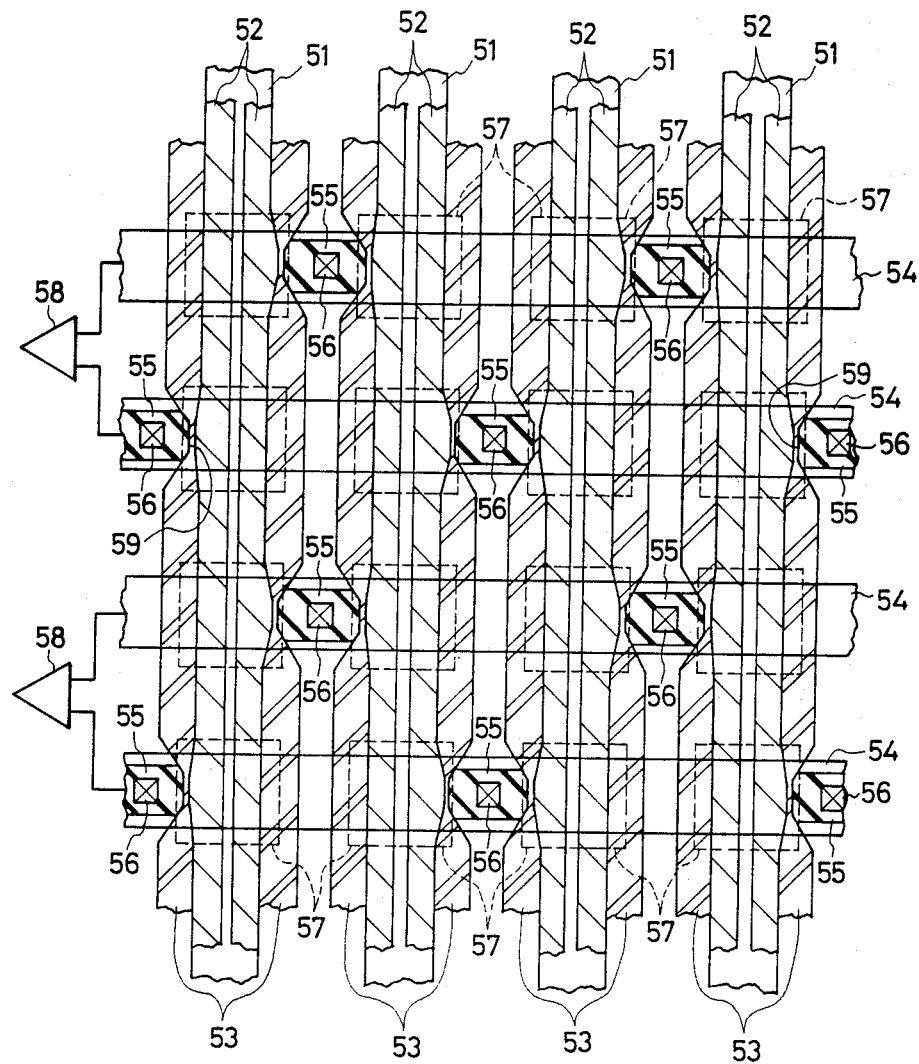
FIG. 16 shows a seventh aspect of the present invention.

Next, another aspect of the present invention will be described with reference to FIG. 16. A plurality of capacitors 57, each formed in the deep hole, are arranged in the matrix form on the surface of the semiconductor substrate. Recesses 51 are then arranged immediately above and parallel with the capacitors 57 so as to overlay with all the capacitors. A field SiO$_2$ film 53 is deposited to the sidewalls of these recesses other than portion to serve as the channel of the switching transistor, and word lines 53 are formed on the right and left of the remaining recesses. The drains 55 to be connected to the bit lines 54 through contact hole 56 are formed in a checkered pattern on pairs of right and left memory cells so as to transmit signals to the capacitors 57 through the channel portion of the gate SiO$_2$ film 59 of the switching transistor. Accordingly to the bit and word line structures, when one of the word lines is turned ON, for example, only the memory cells of every other bit line are turned ON and if the adjacent bit lines are differentially connected to the inputs of the sense amplifier 58 as shown in FIG. 16, the so-called "folded line bit line arrangement" can be accomplished. Since the memory cells are densely disposed in the matrix form, the highest packing density can be accomplished.

Figure 17:
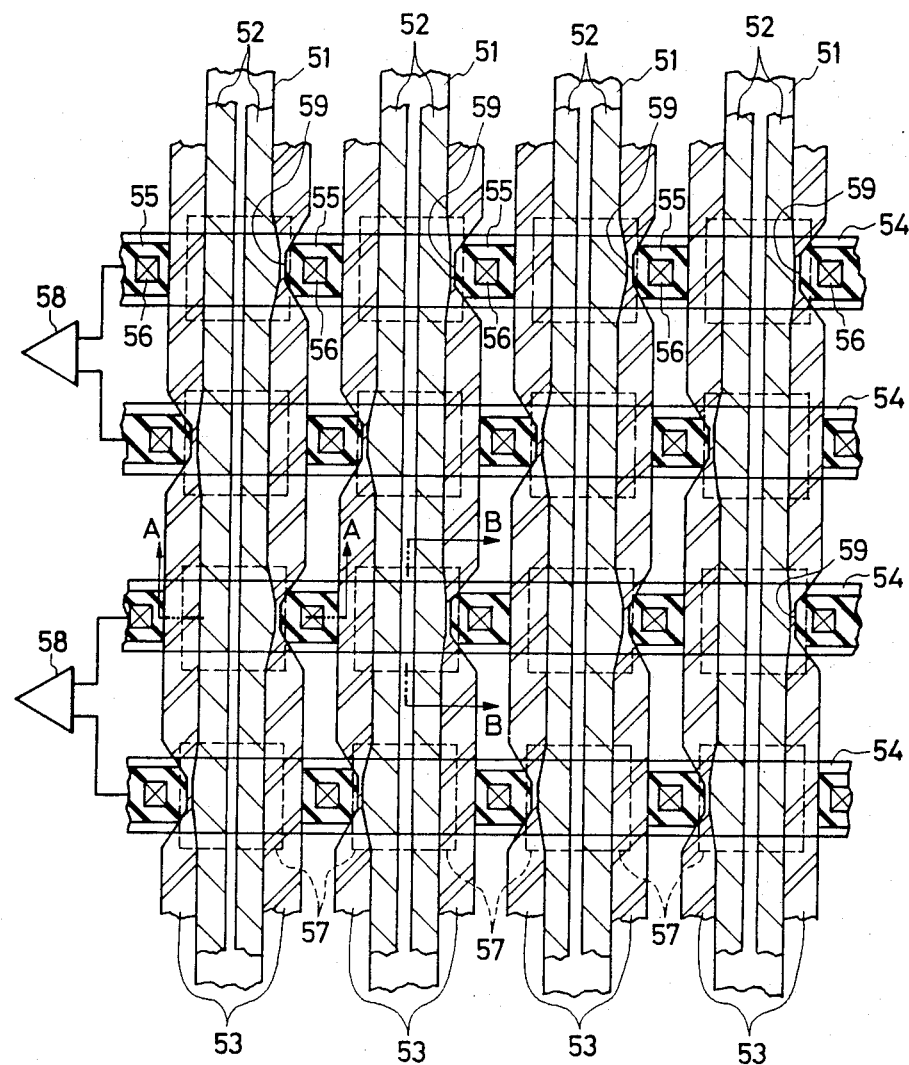
FIG. 17 shows a eighth aspect of the present invention.

FIG. 17 shows still another aspect of the present invention.

In the aspect shown in FIG. 16, the channel portions on which the gate SiO$_2$ films 59 of the pair of adjacent memory cells are formed to face each other, and may interfere if the distance between them is short, so that there is a predetermined limit to higher packing density. However, in the aspect shown in FIG. 17, the drain 55 of the adjacent memory cells is not common but independent drains are disposed. Since the channel of the portion of the gate SiO$_2$ film 59 is spaced apart from the adjacent cell by the field SiO$_2$ film 52, interference with the adjacent cell is extremely low. When one of the word lines is turned ON, the switching transistors connected to every other bit lines are turned ON, and the folded bit line arrangement can be accomplished by differentially operating the adjacent bit lines and detecting the signals by the sense amplifier 58.

The present invention, whose plan view is shown in FIGS. 16 and 17, will be explained with reference to sectional views of FIGS. 18 to 27.

Figure 18:
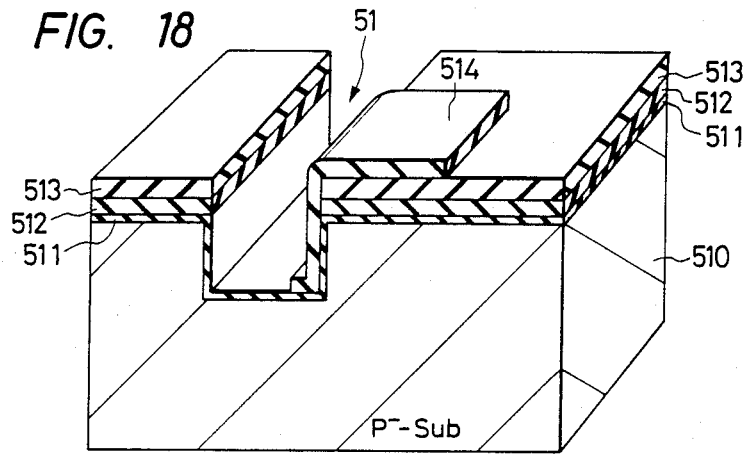
FIGS. 18 to 27 show progressive manufacturing stages in sectional view taken along the line A—A of FIG. 17.

First, a 10 nm-thick thermally oxidized SiO$_2$ film 511 is deposited to a p-type 10 ohm/cm (100) plane Si (silicon) substrate 510 and a 100 nm-thick Si$_3$N$_4$ film 512 is deposited on the SiO$_2$ film 511 by by CVD at a reduced pressure. Next, a 200 nm-thick CVD SiO$_2$ film 513 is deposited on the Si$_3$N$_4$ film. Thereafter, the photoresist at the portion of a recess 51 is removed by ordinary photo-etching, and the three-layered film consisting of the CVD SiO$_2$ film 513/CVD Si$_3$N$_4$ film 512/SiO$_2$ film 511 is sequentially etched by reactive sputter etching by switching sequentially the gas from CHF$_3$, to CF$_4$ to CHF$_3$. The recess 51 which is 1 μm wide and 1 μm deep is formed by etching the Si substrate 510 by reactive sputter etching using CCl$_4$ gas and the three-layered film as the mask. A 10 nm-thick SiO$_2$ film is formed inside the recess as shown in FIG. 18, and a Si$_3$N$_4$ mask 514 is deposited selectively to the portion which is to serve as the channel and drain of the switching transistor by photo-etching.

Figure 19:
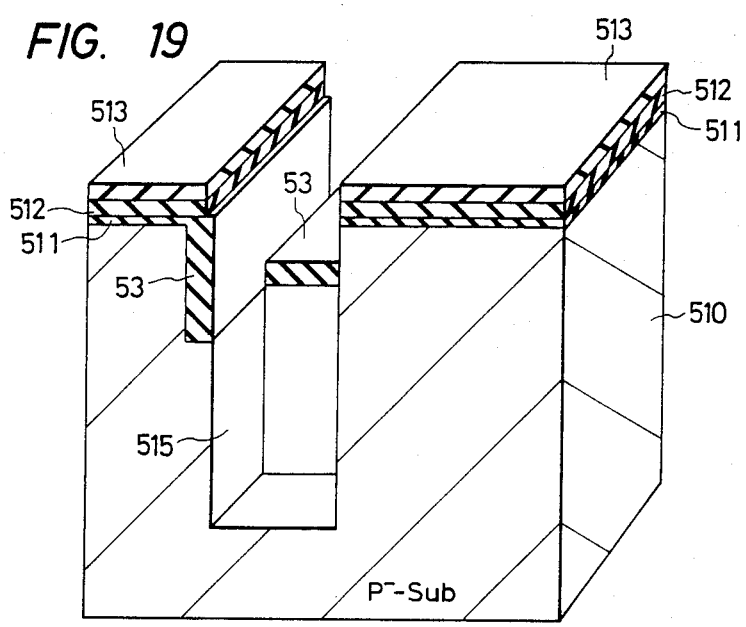

Thereafter, a field SiO$_2$ film 53 is formed at the sidewall and bottom of the recess, to which the Si$_3$N$_4$ mask 514 is not deposited, by wet oxidation at 1,100° C., and a deep hole 515 whose opening is 1 μm by 1 μm is formed by photo-etching and reactive sputter etching using CCl$_4$ gas as shown in FIG. 19. If reactive sputter etching alone is used, contamination and damage at the time of etching will remain. Therefore, the wall surface of the deep hole 515 is etched by solution etching using an HF+HNO$_3$ type etching solution in a thickness of about 0.05 μm.

Figure 20:
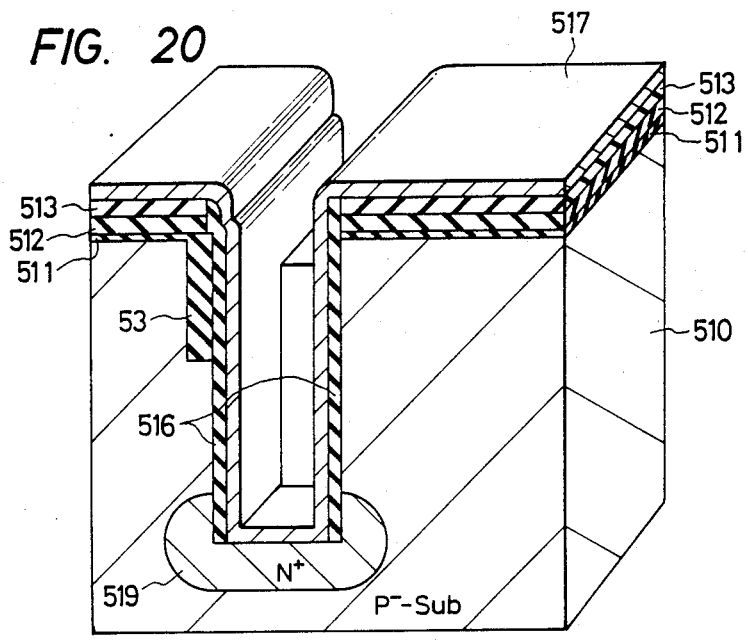

Next, a sheath 516 of 100 nm-thick CVD SiO$_2$ film is deposited to the entire surface and this CVD SiO$_2$ film is then etched over the entire surface using CHF$_3$ gas, so that the sheath 516 remains in the sidewall portions of the deep hole 515 as shown in FIG. 20. A 100 nm-thick polycrystalline Si plate 517 is then deposited.

Phosphorus (P) is added to the polycrystalline Si plate 517, so that a plate wiring 519 is formed at the bottom of the deep hole.

Figure 21:
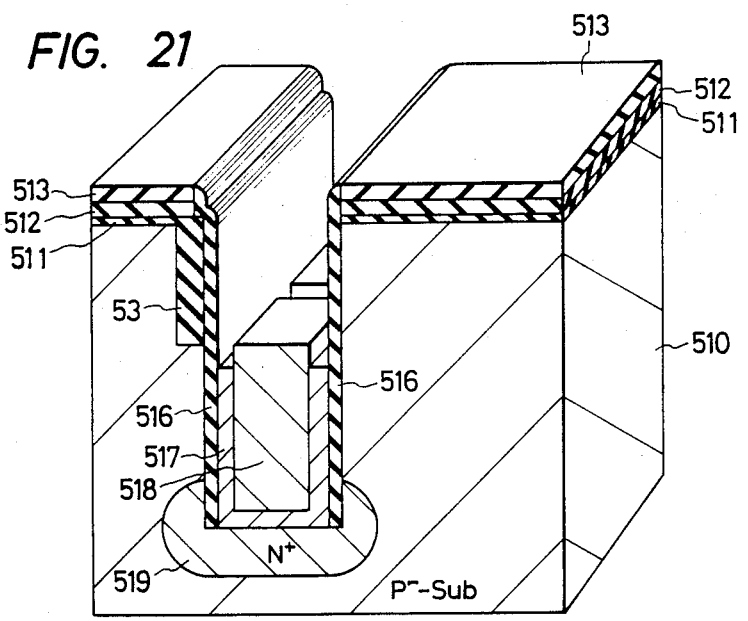

Next, a photo-resist is coated on the entire surface and etching is then carried out on the entire surface by use of O$_2$ plasma to leave the photo-resist 518 which is 1.5 μm deep from the surface of the Si substrate 510. The plate 517 is etched by using the photo-resist as the mask to leave the plate 517 at the lower half of the deep hole 515 as shown in FIG. 21.

Figure 22:
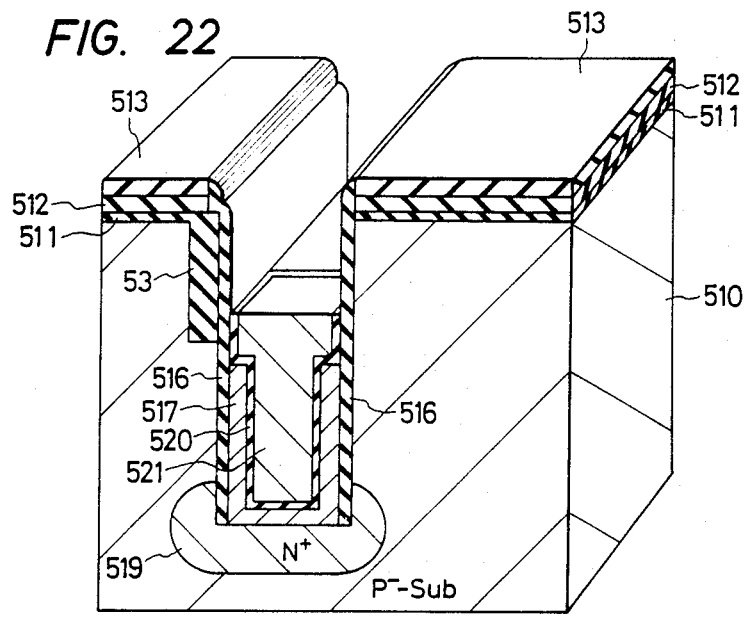

A capacitor insulating film 520, which is a 10 nm-thick SiO$_2$/Si$_3$N$_4$ two-layered film and equivalent to SiO$_2$, is then deposited and polycrystalline Si to which As is added is deposited over the entire surface so as to bury the deep hole 515 and the recess 51. Next, the polycrystalline Si is etched, so that polycrystalline Si remains in a depth of about 1 μm from the surface of the Si substrate 510 as shown in FIG. 22, thereby forming the storage node 521.

Figure 23:
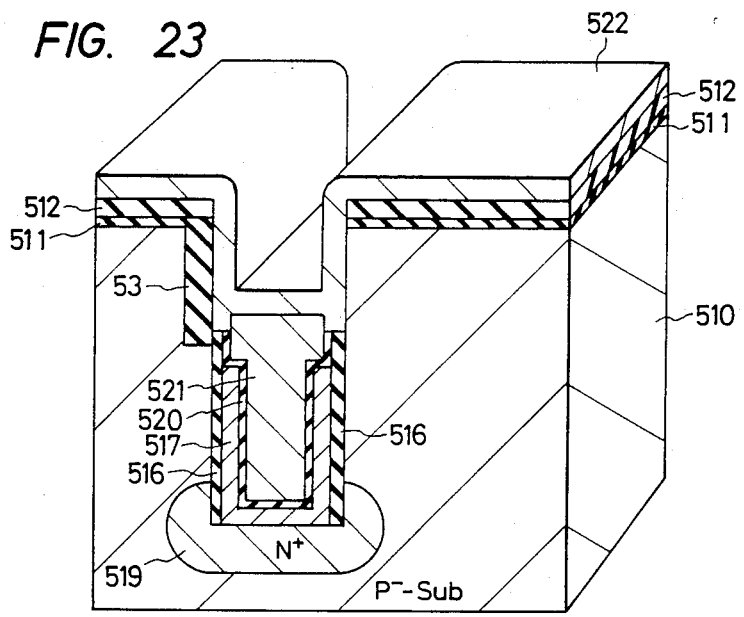

Subsequently, the CVD SiO$_2$ film 513 and the capacitor insulating film 520 are etched using the storage node 521 as the mask to lower the end portions of the CVD SiO$_2$ film 513 and capacitor insulating film 520 from the edge of the upper periphery of the storage node 520. Thereafter, polycrystalline Si film 522 is deposited as shown in FIG. 23.

Figure 24:
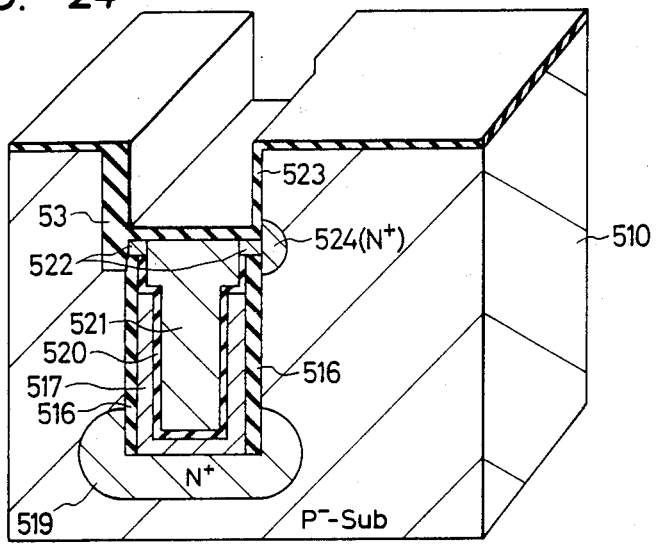

Next, this polycrystalline Si film 522 is etched over the entire surface using CCl$_4$ gas to remove also the Si$_3$N$_4$ film 512. Then, polycrystalline Si 522 which remains around the upper end of the storage node 521 as shown in FIG. 24, end comes into contact with the Si substrate 510 and forms an n$^{30}$ layer source 524 inside the Si substrate 510 through this polycrystalline Si 522. Oblique ion implantation of boron (B) is then made in order to obtain a predetermined threshold voltage and a 10 nm-thick gate SiO$_2$ film 523 is formed by a well known thermal oxidization method.

Figure 25:
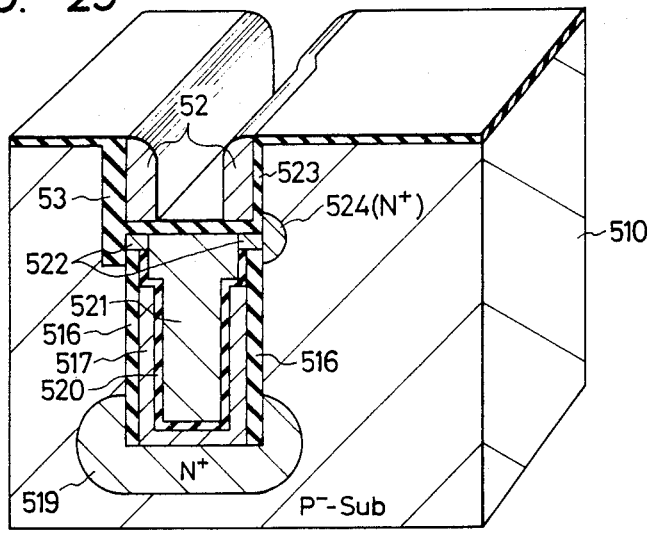

Subsequently, a 200 nm-thick polycrystalline Si film is deposited over the entire surface, and after introduction of phosphorus (P), etching is made over the entire surface. As a result, polycrystalline Si remains on the sidewall of the recess 1 as shown in FIG. 25, thereby forming the word line 52.

Figure 26:
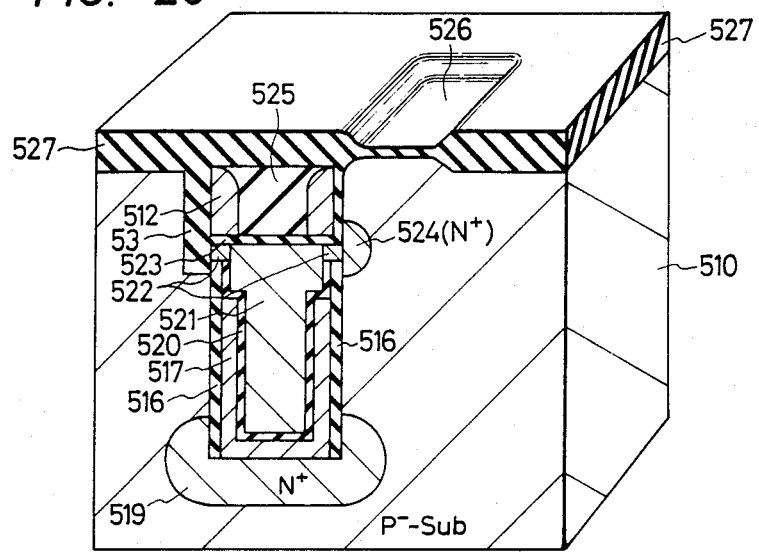

CVD SiO$_2$ film is deposited onto the entire surface and etching is made over the entire surface, to form a buried insulating film 525 at the remaining recess portion as shown in FIG. 26. Next, a 100 nm-thick Si$_3$N$_4$ film is deposited selectively to the drain portion 526 and wet oxidization is made in a thickness of 400 nm, to form a second field SiO$_2$ film 527 over the entire surface.

Figure 27:
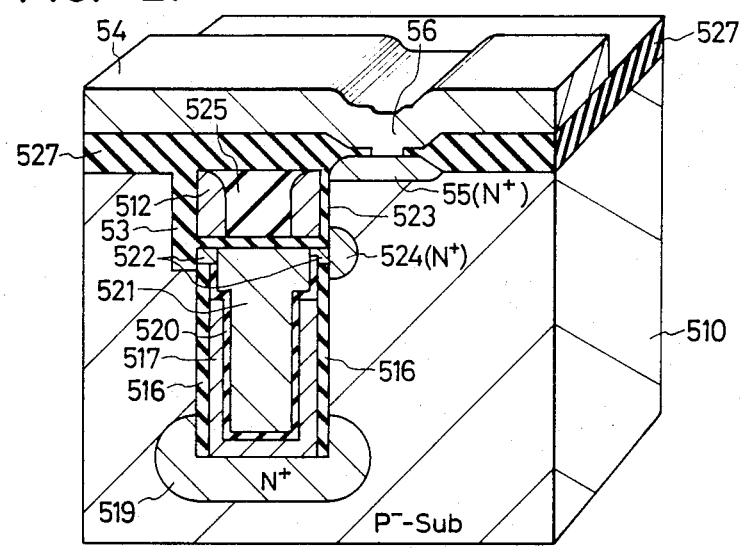

After the Si$_3$N$_4$ film at the drain portion 526 is removed, and As ions are implanted in the dose of $1 \times 10^{16}$ cm$^{-2}$ at 100 keV, to form the drain 55 as a n$^+$ layer and after a contact hole 56 is formed, a 1 μm-thick Al bit line 54 is deposited selectively as shown in FIG. 27.

Figure 28:
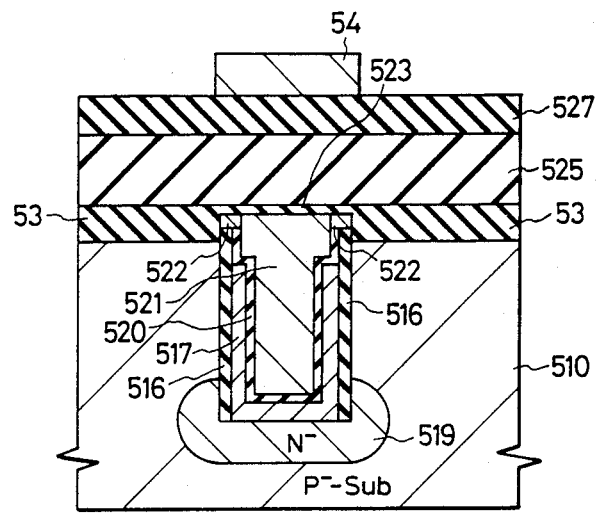
FIG. 28 shows a sectional view taken along Line B—B of FIG. 17.

In the manner described above, the memory array shown in FIGS. 16 and 17 can be constituted. The sectional views of the invention shown in FIGS. 18 to 27 correspond to the section A—A in FIG. 17. FIG. 28 shows the sectional view along line B—B 13 of FIG. 17 which is orthogonal to the section A—A. It is preferred that polycrystalline Si 522 connected to the storage node 521 comes into contact with only the field $SiO_2$ film 53 but not with the Si substrate 510 in this word line direction. If it comes into contact with the Si substrate 510, the a source region is formed at the contact portion so that the distance between the sources of the adjacent cells mush be made sufficiently great to prevent the flow of a leakage current between the adjacent sources.

Figure 29:
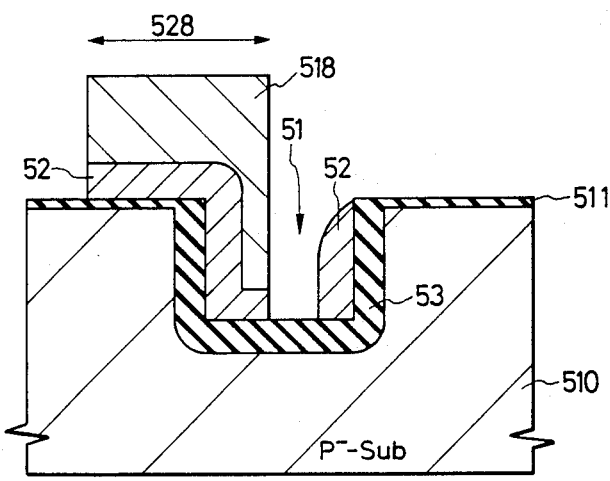
FIG. 29 shows a tenth aspect of the present invention.

When the word line 52 is etched over the entire surface, it remains on the sidewall portion of the recess 51 and extension of the electrode becomes difficult. Therefore, if the photo-resist 518 is left selectively at the electrode extension portion 528, the word line 52 remains at this flat surface portion after the subsequent etching over the entire surface and the electrode can be connected easily at the subsequent stage as shown in FIG. 29.

Though the invention as described above has been explained with reference to the section of one memory cell, the plate wirings 12 can be connected with one another by diffusing phosphorus (P) from the plate 10 in a depth of 1.5 μm because the gap between one memory cell to another is at most from 0.5 to 2 μm, as shown in FIG. 12.

If the photo-resist is deposited selectively to the plate power supply portion 25 at the time of etching of the plate 12 as shown in FIG. 13, the plate 10 remains flatly on the surface of the Si substrate 1 so that the potential (e.g. ½ $V_{cc}$) can be applied at this flat portion to the plate 10 and the plate wirings 12 that connected with one another.

Figure 30:
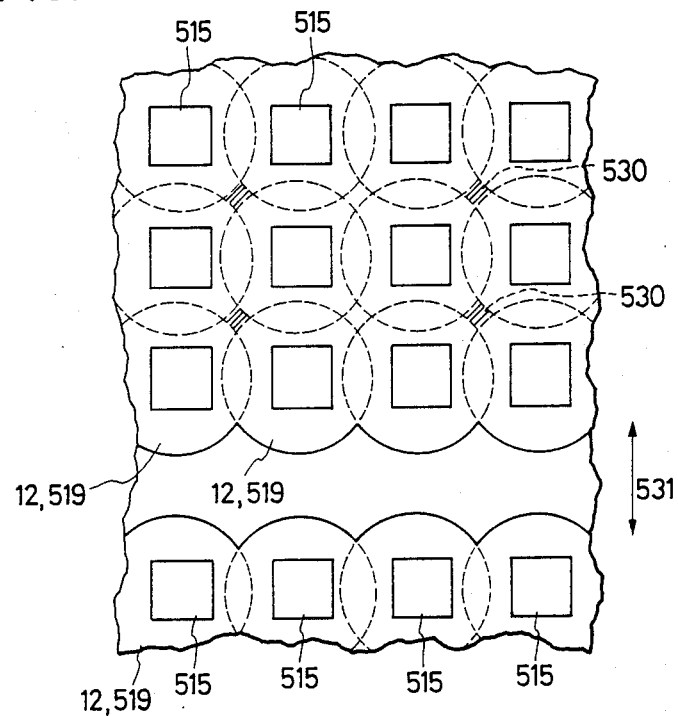
FIG. 30 shows a eleventh aspect of the present invention.

If the memory cells are arranged densely, the plates 12, 519 are connected mutually and there is the possibility that only extremely limited small openings 530 remain (FIG. 30). Since the plate wirings 12, 519 is of the n+-type while the Si substrate 510 is of the p-type, a p-n junction is formed between them and a depletion layer corresponding to the impressed voltage is formed between them. Therefore, even if such small openings 530 exist, they are filled by the depletion layer and the surface portion of the substrate 510 on which the switching transistor of the memory cell exist is isolated, in a sense, by the p-n junction from the Si substrate. Accordingly, the potential fluctuates due to the charge/discharge pulses of the memory and the memory operation becomes unstable. One of the methods of solving this problem is to connect another electrode at a predetermined portion and to apply a predetermined potential to this substrate surface portion. As shown in FIG. 30, another method is to elongate the distance between the memory cells at the predetermined portion and to dispose a substrate connection portion 531 so that the depletion layers extending from the plate wirings 12, 519 do not come into mutual contact.

Figure 31:
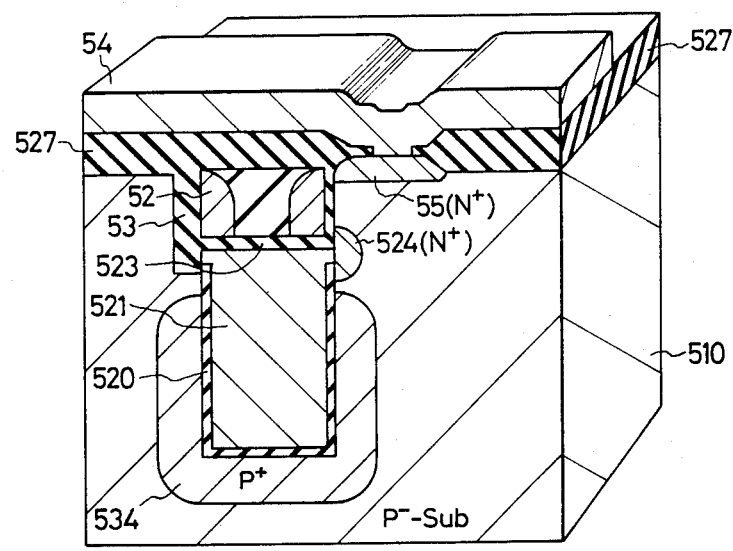
FIG. 31 shows a twelfth aspect of the present invention.

The foregoing descriptions of the present invention illustrate the structure where the capacitor 57 is encompassed by the sheath 516 of an $SiO_2$ film (or other insulating films). It is further possible to dispose a high concentration layer 534 having an impurity concentration of at least $10^{19}$ cm$^{-3}$ on the surface of the deep hole 515 at its lower half as shown in FIG. 31 and to use it as the plate. The capacitor insulating film 520 is deposited directly to this high concentration layer 534 and the storage node 521 is deposited to this capacitor insulating film 520. Since the plate as the high concentration layer 534 is part of the Si substrate 510, the potential of the substrate may be set to the plate potential.

Figure 32:
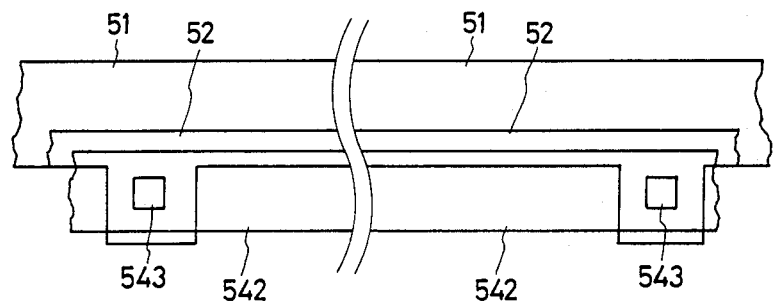
FIG. 32 is a thirteenth aspect of the present invention.

An aspect of the invention is that two word lines are buried in one stripe without limiting the capacitor structure. Though the word line 52, is shown by the simple structure wherein it is buried in the recess, signal delay will be a problem if polycrystalline Si is used for the word line 52 because its sheet resistance is from 20 to 50 ohm/square when it is 200 nm thick. Though the sheet resistance can be reduced to 2 to 5 ohm/square by use of silicides of W, Mo or Ti, it will not be sufficient if the word line 52 is further elongated. In such a case, part of the word line 52 buried in the recess 51 is taken out and a word shunt wire 542 of an Al wiring having a lower specific resistance than polycrystalline Si may be disposed through a through-hole 543 as illustrated in FIG. 32. The number of through-holes to be disposed on one word line 52 is determined by the length of the word shunt wire 542 and the necessary delay time.

Figure 33:
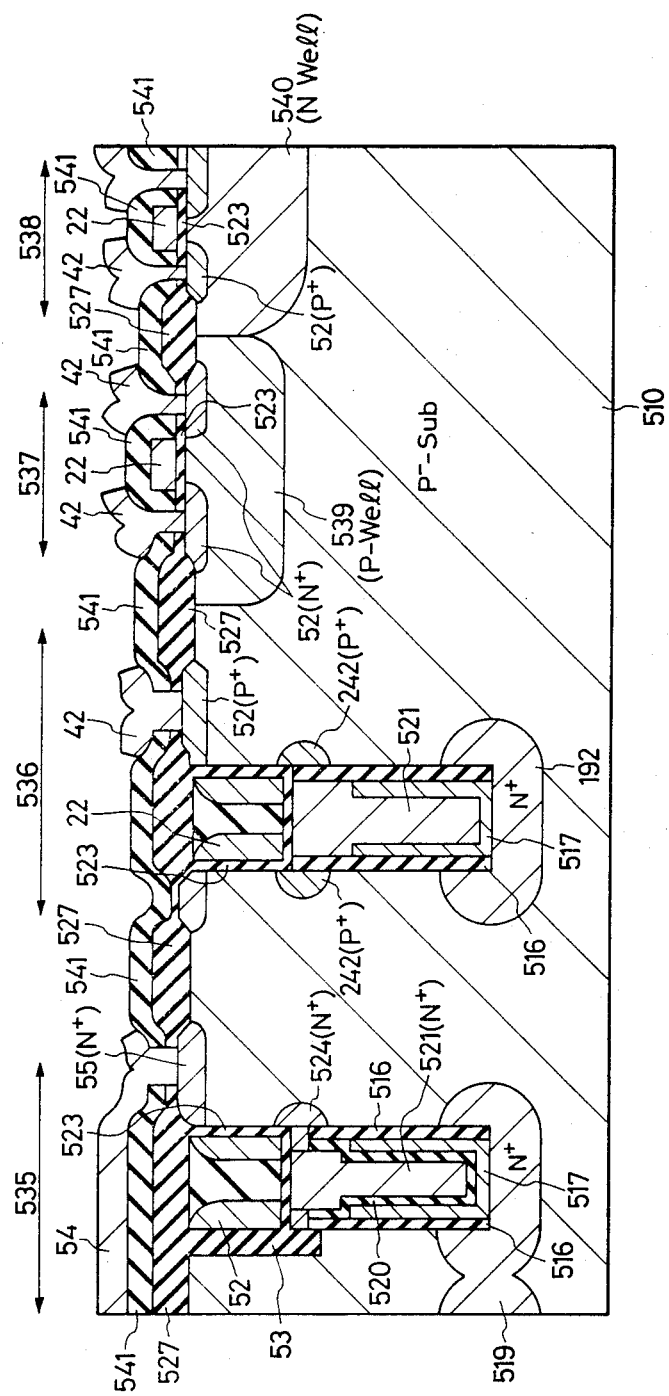
FIG. 33 shows a fourteenth aspect of the present invention.

Though the foregoing descriptions of the present invention show only part of the memory array 535, it is possible to dispose a vertical transistor 536, a planar n-channel device portion 537 which is the same as the prior art device and a p-channel device portion 538 that together constitute a peripheral circuit, as shown in FIG. 33. The common gate of MOS transistors is a gate 22 which is common to the word line 52 and the bit line 54 is common to the source-drain electrode 42. In this case, an inter-level insulating film 541 of a 500 nm-thick CVD $SiO_2$ film is necessary in addition to the second field $SiO_2$ film 527.

When the capacitor insulating film 520 is removed selectively in the vertical transistor 536, the storage node 521 and the plate 517 are connected, and there is formed a vertical transistor 536 consisting of a drain 52, a gate 22 and a source 192 formed by the plate wiring 519. Power may be applied to the source 192 from the upper part of the Si substrate 510 as was shown in FIG. 13. If a p-well 539 and an n-well 540 are formed in the same way as in the prior art, n- and p-channel transistors can be formed in these wells, respectively. The gate $SiO_2$ film 523 of these transistors can be used in common to the memory cell and the vertical transistor 536 or can be formed separately. The method which forms the second field $SiO_2$ film 527 after the formation of the capacitor is employed. It is also possible to employ a method which forms the field $SiO_2$ film at a predetermined portion immediately after the wall is formed and then forms the field $SiO_2$ film in accordance with LOCOS or CVD $SiO_2$ deposition, whenever necessary, as in ordinary integrated circuits.

The capacitor insulating film 520 is a two-layered film consisting of $SiO_2$ and $Si_3N_4$, but it is also possible to use a high dielectric constant insulator such as $Ta_2O_5$ or a $SiO_2$ single substrate film.

Figure 34:
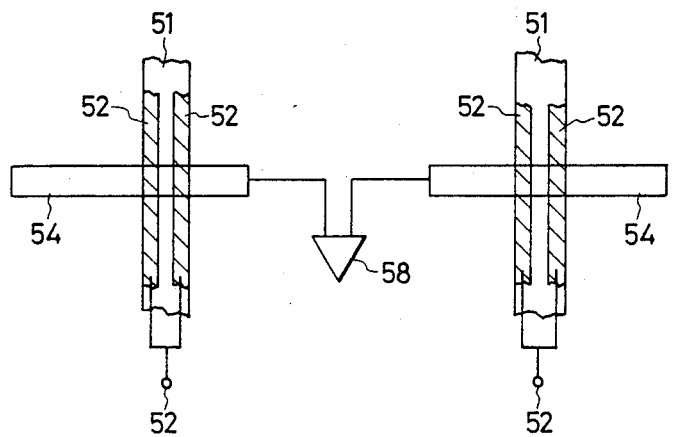
FIG. 34 shows a fifteenth aspect of the present invention.

In the descriptions of the invention described above, the two word lines 52 buried in the recess 51 are driven as separate word lines. However, the open bit line structure can be constituted by mutually connecting the two word lines bured in the one stripe recess shown in FIG. 17 and using them as one word line. In this case, the inputs of the sense amplifier 58 shown in FIG. 17 are divided to the right and left as shown in FIG. 34.

According to the present invention, the word line 18 can be buried in a recess of the Si substrate so that the drain to be connected to the bit line can be formed freely and higher packing density of memory can be achieved. Since the drain region can be reduced, the noise charge due to the α-particles incident to this portion can be reduced and the soft error ratio due to the α-particles can be reduced.

In accordance with the present invention, the capacitors buried in the deep holes can be arranged densely and the folded bit line structure can be constituted. Therefore, the present invention provides a great advantage in the higher packing density and stable circuit operation. Since the word line is buried not only in the folded bit line structure but also in the open bit line structure, the step on the surface portion of the Si substrate is reduced and patterning of the integrated circuit becomes easier.

Since the channel portion of the switching transistor is formed in the minimum necessary area only at part of the recess, the areas of the source and drain coming into contact with this channel can be reduced, and the inflow of the noise charge due to the α-particles as well as the soft error due to the α-particles can be reduced.

When sheath type plate electrodes ar employed, they are not easily affected by the substrate and by the incident α-particles, and the soft error due to the α-particles can be further reduced.

It is further understood by those skilled in the art that the foregoing description is a preferred description and that various changes and modifications may be made in the invention without departing from the spirit and scope thereof.

What is claimed is:

1. A semiconductor memory comprising,
   a semiconductor substrate;
   a plurality of memory cells, each including a deep hole bored in said semiconductor substrate;
      a capacitor formed on a sidewall portion at the lower half of said deep hole, the capacitor comprising a storage node disposed inside said deep hole, a sheath type plate electrode, a capacitance insulating film disposed between said storage node and said sheath type plate electrode and an insulating film encompassing said sheath type plate electrode; and a switching transistor formed immediately above said capacitor;
   word lines for selecting said memory cells, wherein at least half of each word line forms a gate of said switching transistor of each memory cell and is buried in one of a plurality of elongated recesses formed in a surface portion of said semiconductor substrate;
   bit lines for transferring data; and
   voltage impression means connected to said sheath type plate electrode which impresses a voltage to said sheath type plate electrode which is different from a voltage impressed to said semiconductor substrate.

2. A semiconductor memory according to claim 1, wherein the portion of each said word line buried in said elongated recess is two word lines.

3. A semiconductor memory according to claim 1, wherein each said word line is disposed through an insulating film disposed therebelow.

4. A semiconductor memory according to claim 1, wherein said memory cells constitute a folded bit line structure and have an amplifier for differentially amplifying the bit of said data lines.

5. A semiconductor memory according to claim 1, wherein said voltage impression means comprises a high concentration impurity region having an opposite conductivity type to that of said semiconductor substrate and being disposed at the bottom of said deep hole of each memory cell, and a wiring layer connected electrically to said high concentration impurity region and extending to the surface portion of said semiconductor substrate.

6. A semiconductor memory according to claim 1, wherein each of said word line is completely buried in one of said elongated recesses and a substantially flat insulating layer is disposed between said bit lines and said word lines.

7. A semiconductor memory according to claim 1, further including high concentration impurity regions being disposed at the bottom of said deep hole of each memory cell, wherein high concentration impurity regions disposed in at least two adjacent memory cells are arranged to be in contact with each other and wherein at least some of said high concentration impurity regions are arranged so that they do not contact a depletion layer which extends from adjacent high concentration impurity regions.

8. A semiconductor memory according to claim 1, wherein said word line contains at least polycrystalline silicon and is connected electrically to a word shunt line having lower specific resistance than that of said word line.

9. A semiconductor memory according to claim 1, wherein said switching transistor of each memory cell has a source and a drain, self-aligned to said gate of said switching transistor.

10. A semiconductor memory according to claim 1, further comprising a peripheral circuit of p-channel transistors disposed in n-type well regions and n-channel transistors disposed in p-type well regions.

11. A semiconductor memory comprising,
    a semiconductor substrate;
    a plurality of memory cells, each including
       a deep hole bored in said semiconductor substrate;
       a capacitor formed on a sidewall portion at the lower half of said deep hole, the capacitor comprising a storage node disposed inside said deep hole, a sheath type plate electrode, a capacitance insulating film disposed between said storage node and said sheath type plate electrode and an insulating film encompassing said sheath type plate electrode; and a switching transistor formed immediately above said capacitor, the switching transistor having a source and a drain self-aligned to a gate;
    word lines connected to the gate of said switching transistor of each memory cell for selecting said memory cells, said word lines and said gates being formed integrally with each other, wherein each word line is buried in one of a plurality of elongated recesses formed in a surface of said semiconductor substrate, said recesses being elongated in the same direction as the direction in which said word lines extend;
    bit lines connected to the drains or sources of said switching transistor of each memory cell for transferring data from said memory cells; and
    voltage impression means connected to said sheath type plate electrode which impresses a voltage to said sheath type plate electrode which is different from a voltage impressed to said semiconductor substrate.

12. A semiconductor memory according to claim 11, wherein said memory cells constitute a folded bit line structure and have an amplifier for differentially amplifying data of said bit line.

13. A semiconductor memory according to claim 11, wherein said voltage impression means comprises a high concentration impurity region disposed at the bottom of said deep hole of each memory cell and having an opposite conductivity type to that of said semiconductor substrate and a wiring layer connected electrically to said high concentration impurity region and extending to the surface portion of said semiconductor substrate.

14. A semiconductor memory according to claim 11, wherein each said word line is completely buried in one of said elongated recesses, and a substantially flat insulating film is disposed between said bit lines and said word lines.

15. A semiconductor memory according to claim 11, further including high concentration impurity regions being disposed at the bottom of said deep hole of each memory cell, wherein high concentration impurity regions disposed in at least two adjacent memory cells are arranged to be in contact with each other and wherein at least some of said high concentration impurity regions are arranged so that they do not contact a depletion layer which extends from adjacent high concentration impurity regions.

16. A semiconductor memory according to claim 15, wherein said word line contains at least polycrystalline silicon and is connected electrically to a word shunt line having lower specific resistance than that of said word line.

17. A semiconductor memory according to claim 11, further comprising a peripheral circuit of p-channel transistors disposed in n-type well regions and n-channel transistors disposed in p-type well regions.

18. A semiconductor memory comprising,
a semiconductor substrate;
a plurality of memory cells, each including
a deep hole bored in said semiconductor substrate;
a capacitor formed on a sidewall portion at the lower half of said deep hole, the capacitor comprising a storage node disposed inside said deep hole, a sheath type plate electrode, a capacitance insulating film disposed between said storage node and said sheath type plate electrode and an insulating film encompassing said sheath type plate electrode; and
a switching transistor formed immediately above said capacitor, the switching transistor having a source and a drain self-aligned to a gate;
word lines connected to the gate of said switching transistor of each memory cell for selecting said memory cells, said word lines and said gates being formed integrally with each other, wherein two word lines buried in each one of a plurality of elongated recesses formed in a surface of said semiconductor substrate, said recesses being elongated in the same direction as the direction in which said word lines extend;
bit lines connected to the drains or sources of said switching transistor of each memory cell for transferring data from said memory cells; and
voltage impression means connected to said sheath type plate electrode which impresses a voltage to said sheath type plate electrode which is different from a voltage impressed to said semiconductor substrate.

19. A semiconductor memory according to claim 18, wherein said memory cells constitute a folded bit line structure and have an amplifier for differentially amplifying the data of said bit lines.

20. A semiconductor memory according to claim 18, wherein said voltage impression means comprises a high concentration impurity region disposed at the bottom of said deep hole of each memory cell and having an opposite conductivity type to that of said semiconductor substrate and a wiring layer connected electrically to said high concentration impurity region and extending to the surface portion of said semiconductor substrate.

21. A semiconductor memory comprising,
a semiconductor substrate;
an epitaxial layer formed on said semiconductor substrate;
a plurality of memory cells, each including a deep hole bored in said epitaxial layer;
a capacitor formed on a sidewall portion at the lower half of said deep hole, the capacitor comprising a storage node disposed inside said deep hole, a sheath type plate electrode, a capacitance insulating film disposed between said storage node and said sheath type plate electrode and an insulating film encompassing said sheath type plate electrode; and a switching transistor formed immediately above said capacitor;
word lines for selecting said memory cells, wherein at least half of each word line forms a gate of said switching transistor of each memory cell and is buried in one of a plurality of elongated recesses formed in a surface portion of said epitaxial layer;
bit lines for transferring data; and
voltage impression means connected to said sheath type plate electrode which impresses a voltage to said sheath type plate electrode which is different from a voltage impressed to said epitaxial layer.

22. A semiconductor memory according to claim 21, wherein the portion of each said word line buried in said elongated recess is two word lines.

23. A semiconductor memory according to claim 21, wherein each said word line is disposed through an insulating film disposed therebelow.

24. A semiconductor memory according to claim 21, wherein said memory cells constitute a folded bit line structure and have an amplifier for differentially amplifying the data of said bit lines.

25. A semiconductor memory according to claim 21, wherein said voltage impression means consists of comprises a high concentration impurity region having an opposite conductivity type to that of said epitaxial layer and being disposed at the bottom of said deep hole of each memory cell, and a wiring layer connected electrically to said high concentration impurity region and extending to the surface portion of said epitaxial layer.

26. A semiconductor memory according to claim 25, wherein said high concentration impurity region is a buried layer disposed between said semiconductor substrate and said epitaxial layer.

27. A semiconductor memory according to claim 21, wherein each said word line is completely buried in one of said elongated recesses and a substantially flat insulating layer is disposed between said bit lines and said word lines.

28. A semiconductor memory according to claim 21, further including high concentration impurity regions being disposed at the bottom of said deep hole of each memory cell, wherein high concentration impurity regions disposed in at least two adjacent memory cells are arranged to be in contact with each other and wherein at least some of said high concentration impurity regions are arranged so that they do not contact a depletion layer which extends from adjacent high concentration impurity regions.

29. A semiconductor memory according to claim 21, wherein said word line contains at least polycrystalline silicon and is connected electrically to a word shunt line having lower specific resistance than that of said word line.

30. A semiconductor memory according to claim 21, wherein said switching transistor of each memory cell has a source and a drain, self-aligned to said gate of said switching transistor.

31. A semiconductor memory according to claim 21, further comprising a peripheral circuit of p-channel transistors disposed in n-type well regions and n-channel transistors disposed in p-type well regions.

32. A semiconductor memory comprising,
a semiconductor substrate;
an epitaxial layer formed on said semiconductor substrate;
a plurality of memory cells, each including
a deep hole bored in said epitaxial layer;
a capacitor formed on a sidewall portion at the lower half of said deep hole, the capacitor comprising a storage node disposed of said deep hole, a sheath type plate electrode, a capacitance insulating film disposed between said storage node and said sheath type plate electrode and an insulating film encompassing said sheath type plate electrode; and a switching transistor formed immediately above said capacitor, the switching transistor having a source and a drain self-aligned to a gate;
word lines connected to the gate of said switching transistor of each memory cell for selecting said memory cells, said word lines and said gates being formed integrally with each other, wherein each word line is buried in one of a plurality of elongated recesses formed in a surface of said epitaxial layer, said recesses being elongated in the same direction as the direction in which said word lines extend;
bit lines connected to the drains or sources of said switching transistor of each memory cell for transferring data from said memory cells; and
voltage impression means connected to said sheath type plate electrode which impresses a voltage to said sheath type plate electrode which is different from a voltage impressed to said epitaxial layer.

33. A semiconductor memory according to claim 32, wherein said memory cells constitute a folded bit line structure and have an amplifier for differentially amplifying data of said bit lines.

34. A semiconductor memory according to claim 32, wherein said voltage impression means comprises a high concentration impurity region disposed at the bottom of said deep hole of each memory cell and having an opposite conductivity type to that of said epitaxial layer and a wiring layer connected electrically to said high concentration impurity region and extending to the surface portion of said epitaxial layer.

35. A semiconductor memory according to claim 34, wherein said high concentration impurity region is a buried layer disposed between said semiconductor substrate and said epitaxial layer.

36. A semiconductor memory according to claim 32, wherein each said word line is completely buried in one of said elongated recesses, and a substantially flat insulating film is disposed between said bit lines and said word lines.

37. A semiconductor memory according to claim 32, further including high concentration impurity regions being disposed at the bottom of said deep hole of each memory cell, wherein high concentration impurity regions disposed in at least two adjacent memory cells are arranged to be in contact with each other and wherein at least some of said high concentration impurity regions are arranged so that they do not contact a depletion layer which extends from adjacent high concentration impurity regions.

38. A semiconductor memory according to claim 32, wherein said word line contains at least polycrystalline silicon and is connected electrically to a word shunt line having lower specific resistance than that of said word line.

39. A semiconductor memory according to claim 32, further comprising a peripheral circuit of p-channel transistors disposed in n-type well regions and n-channel transistors disposed in p-type well regions.

40. A semiconductor memory comprising,
a semiconductor substrate;
an epitaxial layer formed on said semiconductor substrate;
a plurality of memory cells, each including
a deep hole bored in said epitaxial layer;
a capacitor formed on a sidewall portion at the lower half of said deep hole, the capacitor comprising a storage node disposed inside said deep hole, a sheath type plate electrode, a capacitance insulating film disposed between said storage node and said sheath type plate electrode and an insulating film encompassing said sheath type plate electrode; and
a switching transistor formed immediately above said capacitor, the switching transistor having a source and a drain self-aligned to a gate;
word lines connected to the gate of said switching transistor of each memory cell for selecting said memory cells, said word lines and said gates being formed integrally with each other, wherein two word lines buried in each one of a plurality of elongated recesses formed in a surface of said epitaxial layer, said recesses being elongated in the same direction as the direction in which said word lines extend;
bit lines connected to the drains of sources of said switching transistor of each memory cell for transferring data from said memory cells; and
voltage impression means connected to said sheath type plate electrode which impresses a voltage to said sheath type plate electrode which is different from a voltage impressed to said epitaxial layer.

41. A semiconductor memory according to claim 40, wherein said memory cells constitute a folded bit line structure and have an amplifier for differentially amplifying the data of said bit lines.

42. A semiconductor memory according to claim 40, wherein said voltage impression means comprises a high concentration impurity region disposed at the bottom of said deep hole of each memory cell and having an opposite conductivity type to that of said epitaxial layer and a wiring layer connected electrically to said high concentration impurity region and extending to the surface portion of said epitaxial layer.

* * * * *